(12) United States Patent
Heiderscheit et al.

(10) Patent No.: US 7,054,601 B2
(45) Date of Patent: May 30, 2006

(54) APPARATUS AND METHOD FOR STORING AND SELECTING RADIO STATIONS

(75) Inventors: David D. Heiderscheit, Crystal Lake, IL (US); Michael Barnea, Highland Park, IL (US); Steven G. Palmer, Huntley, IL (US); Tsung-Wen Sheng, Inverness, IL (US)

(73) Assignee: Motorola, Inc., Schaumburg, IL (US)

( * ) Notice: Subject to any disclaimer, the term of this patent is extended or adjusted under 35 U.S.C. 154(b) by 377 days.

(21) Appl. No.: 10/340,515

(22) Filed: Jan. 8, 2003

(65) Prior Publication Data

US 2004/0198282 A1 Oct. 7, 2004

(51) Int. Cl.
*H04B 1/18* (2006.01)
*H04Q 7/20* (2006.01)

(52) U.S. Cl. ............................... 455/179.1; 455/185.1; 455/186.1; 455/166.2; 455/456.3; 455/456.5

(58) Field of Classification Search ............. 455/179.1, 455/185.1, 186.1, 166.2, 184.1, 456.1, 456.3, 455/456.5, 404.2, 414.2, 414.3, 512, 514, 455/435.2, 435.3
See application file for complete search history.

(56) References Cited

U.S. PATENT DOCUMENTS

| | | | | |
|---|---|---|---|---|
| 4,223,352 A | * | 9/1980 | Belisomi ..................... 348/732 |
| 5,152,011 A | * | 9/1992 | Schwob .................... 455/158.5 |
| 5,640,696 A | * | 6/1997 | Ishikawa et al. .......... 455/186.2 |
| 6,016,120 A | * | 1/2000 | McNabb et al. ........ 342/357.06 |
| 6,021,320 A | * | 2/2000 | Bickford et al. .......... 455/186.1 |
| 6,271,798 B1 | * | 8/2001 | Endo et al. .................. 343/713 |
| 6,470,186 B1 | * | 10/2002 | Whikehart et al. ....... 455/456.1 |
| 2003/0013425 A1 | * | 1/2003 | Nee .......................... 455/186.1 |

FOREIGN PATENT DOCUMENTS

JP          2-103700          * 4/1990

* cited by examiner

*Primary Examiner*—Duc M. Nguyen
(74) *Attorney, Agent, or Firm*—Kevin D. Wills; Terri S. Hughes

(57) ABSTRACT

A method of storing and selecting a radio station (104, 106) in a radio (102) having a plurality of tuner presets (130) and a plurality of memory locations (146) assigned to each of the plurality of tuner presets, includes storing a plurality of radio stations (104, 106) under a tuner preset (134), where each of the plurality of radio stations is stored as a record (148) in one of the plurality of memory locations assigned to the tuner preset. The record can include a radio station frequency (150) and a geographic position (152) of the radio at a time that the record is stored. In response to subsequent selection of the tuner preset (134), a radio station is selected from the plurality of radio stations stored under the tuner preset and includes identifying the record having the geographic position that is closest to a geographic position (253) of the radio at a time that the tuner preset is selected and tuning the radio to the radio station frequency (150) of the identified record.

15 Claims, 7 Drawing Sheets

APPARATUS AND METHOD FOR STORING AND SELECTING RADIO STATIONS

BACKGROUND OF THE INVENTION

Most car radios have an electronic tuner with multiple radio station presets. Typically, a user stores a radio station under a desired preset by tuning to a desired station and then pressing and holding the desired preset button for a short period of time until some form of confirmation (e.g., an audible "beep") indicates that the radio has stored the station under that preset. In most radios, each preset can store, at most, only one station per band—i.e., one AM station and one FM station. Some radios allow different users to store presets, but each user can store only one station per band under a given preset.

When traveling from one geographical area to another (e.g., during a business trip, vacation, etc.), a driver loses the convenience of his preset stations. The driver goes out of range of preset station, and stations begin to fade, necessitating manual tuning. When the driver reaches his destination away from home, he has the option of re-programming the radio presets, but this has the disadvantage of erasing his previously stored stations (i.e., those corresponding to his hometown) such that, when the driver returns home from his vacation or business trip, he must go through the entire process of programming the presets again. This is very inconvenient, especially for drivers who frequently travel out of the area in which their favorite stations are receivable.

Alternatively, one type of existing car radio allows the traveler to engage a "sweep" feature that temporarily stores a number of stations that are broadcasting in the area through the which the traveler is driving. While this approach has the advantage of not erasing the driver's "hometown" presets, it falls short of providing user-defined presets at multiple locations.

More sophisticated prior art approaches include a look-up table of stations in a particular broadcast area. However, these look-up tables can become outdated quickly. Although updating can take place on sub-carrier frequencies, this requires a sophisticated sub-carrier communication system be included with a radio set, increasing cost and complexity. In addition, not all radio stations provide updating services necessary to support this function. Another disadvantage of the prior art is that signal strength approaches to updating presets are hardware intensive, further increasing cost and complexity of a radio set.

Accordingly, there is a significant need for an apparatus and method that overcomes the disadvantages of the prior art outlined above.

DESCRIPTION OF THE PREFERRED EMBODIMENTS

In the following detailed description of exemplary embodiments of the invention, reference is made to the accompanying drawings (where like numbers represent like elements), which illustrate specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical, electrical, or logical contact. However, "coupled" may mean that two or more elements are not in direct contact with each other, but yet still co-operate or interact with each other.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

Figure 1:
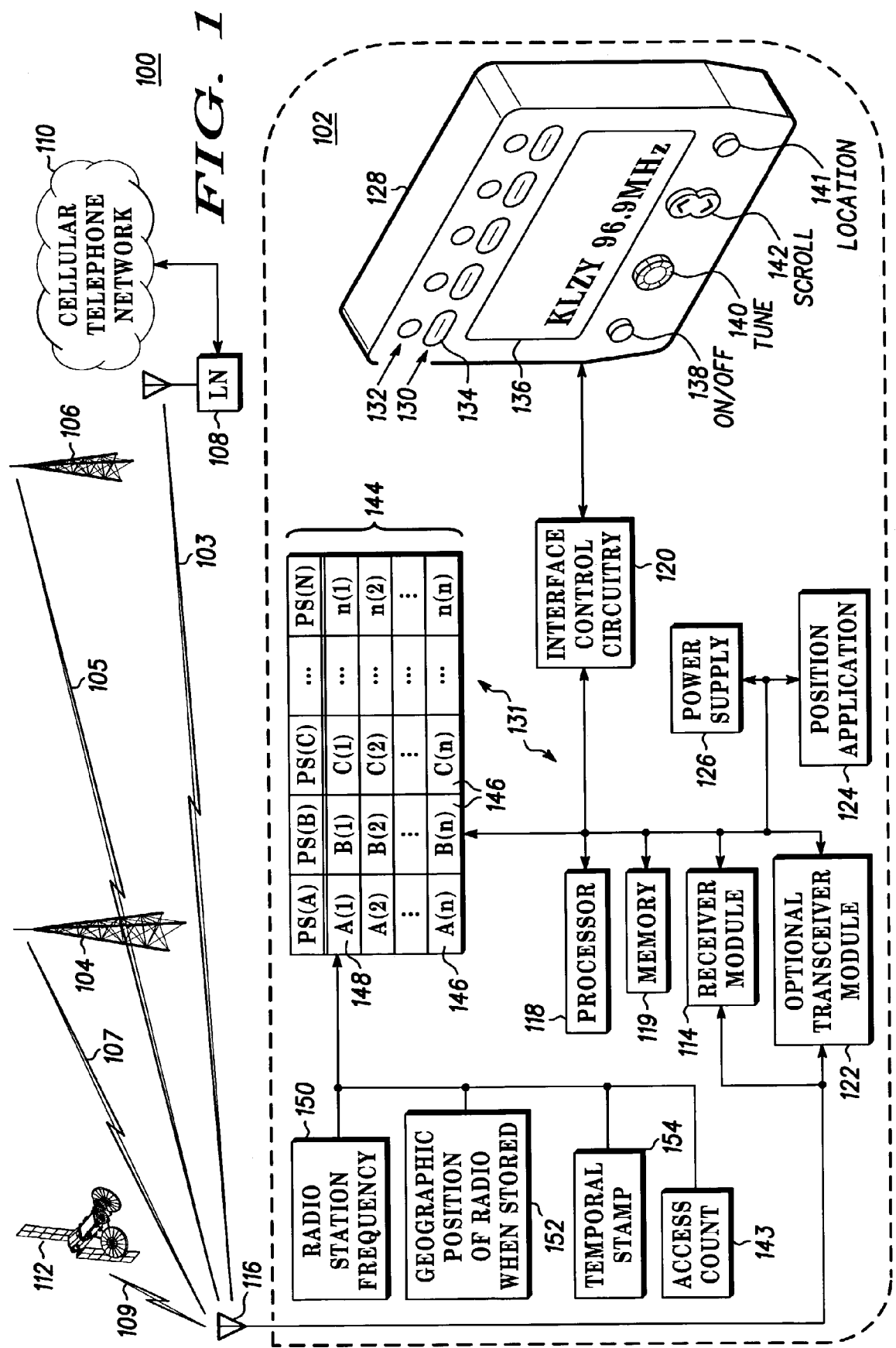
FIG. 1 is a block diagram of a communication system according to an embodiment of the invention.

FIG. 1 is a block diagram of a communication system 100 according to an embodiment of the invention. As shown in FIG. 1, communication system 100 includes a radio 102, which can include any wireless device that is capable of receiving wireless communication, such as a portable radio, a cellular phone with a radio receiver, a car radio, a computer with a radio receiver, and the like. Radio 102 is capable of receiving wireless transmissions from a plurality of radio stations 104, 106 or via a satellite 112 over wireless links 105, 107 and 109 respectively. Plurality of radio stations 104, 106 can include, without limitation, commercial radio stations, AM radio stations and sub-carriers, FM radio stations and sub-carriers, satellite radio (XM), short-wave radio, and the like. In an embodiment of the invention, plurality of radio stations can include radio transmissions received from satellite 112.

In an embodiment, radio 102 can also send and/or receive content from cellular telephone network 110 via local node 108 and wireless link 103. Cellular telephone network 110 can send and receive content from a cellular network, paging network, satellite networks, and the like. Cellular telephone network 110 can include narrowband and/or broadband communications with standard cellular network protocols such as Global System for Mobile Communications (GSM), Time Division Multiple Access (TDMA), Code Division Multiple Access (CDMA), and the like. In another embodiment, standard transmission control protocol/internet protocol (TCP/IP) can also be used. In yet another embodiment, messaging protocols such Short Message Service Cell Broadcast (SMSCB), General Packet Radio Service (GPRS), and the like, can be used. Cellular telephone network 110 can be coupled to a public switched telecommunication network (PSTN) (not shown), Internet (not shown), an integrated services digital network (ISDN) (not shown), satellites 112, local area networks (LAN's) (not shown), wide area networks (WAN's) (not shown), other communications systems, and the like.

In an embodiment, radio 102 has a common antenna 116, which can feed receiver module 114 and optional transceiver module 122. Receiver module 114 is designed to receive wireless communication from plurality of radio stations 104, 106. Optional transceiver module 122 is designed to send and/or receive content from cellular telephone network 110. Both receiver module 114 and optional transceiver module 122 can share power supply 126 and communicate with interface control circuitry 120.

Radio 102 can include a processor 118 for processing algorithms stored in memory 119. Memory 119 comprises algorithms, and can include, but is not limited to, random access memory (RAM), read only memory (ROM), flash memory, electrically erasable programmable ROM (EEPROM), and the like. Memory 119 can contain stored instructions, tables, data, and the like, to be utilized by processor 118.

Radio 102 can also include position application 124, which can include the use of any number of position sources, devices and software elements designed to determine a location of radio 102. Examples of sources and devices, without limitation, include global positioning system (GPS), differential GPS, a kiosk (fixed position source), and enhanced observed time difference (EOTD), which comprise terrestrial cellular triangulation, and the like.

Radio 102 can also include human interface (H/I) 128, which can comprise elements such as a display 136, an ON/OFF controller knob 138, a tuning knob 140, scroll buttons 142, location selection input 141, plurality of tuner preset buttons 130, one or more indicators 132 such as bulbs or light emitting diodes (LEDs), and the like. The elements shown on human interface 128 are not limiting and other elements can be included, for example, speakers, a microphone, and the like. Human interface 128 can be used to request and display content, including application data, position data, personal data, audio/video, and the like. As those skilled in the art will appreciate, the (H/I) elements outlined above are meant to be representative and to not reflect all possible (H/I) elements that may be employed.

Radio 102 includes an electronic tuner 131, which can comprise memory array 144. Memory array 144 can include a plurality of memory locations 146 assigned to each tuner preset 134. Each memory location 146 can store a record 148 corresponding to a tuner preset 134. For example, tuner preset 134 can have a plurality of memory locations 146 assigned under PS(A), such as A(1), A(2), up to A(n), where PS(A) stands for Pre Set (A), and A(1) to A(n) are records stored in memory locations 146.

A record 148 can be stored, for example, by tuning to a radio station and holding down a tuner preset 134 until an audible "beep" occurs. In an embodiment, record 148 includes radio station frequency 150, geographic position of radio at the time record is stored 152 (location tag) and a temporal stamp 154. In a further embodiment, each record 148 includes an access count 143, which is initialized to zero when record 148 is initially stored. Radio station frequency 150 includes the transmission frequency of the desired radio station such that electronic tuner 131 can tune radio 102 to the desired one of the plurality of radio stations 104, 106, and optionally, radio station identification means such as call letters, signal strength, and the like.

Geographic position of radio at the time record is stored 152 can include the longitude, latitude, elevation, and the like of radio 102 when tuner preset 134 is used to store radio station 104, 106. Position application 124 can be used to determine geographic position using, for example, GPS, cell locations as determined by cellular telephone network 110, and the like. In another embodiment, location selection input 141 on human interface 128 can be utilized such that a user selects from a current position of radio or any stored positions, such as "position 1," "position 2," and the like. The current geographic position of radio can be determined in an analogous manner.

Temporal stamp 154 can include the time of day, day of the week, day of the month, day of the year, and the like that radio station 104, 106 is stored under tuner preset 134. In another embodiment, record 148 does not include temporal stamp 154. In another embodiment, temporal stamp 154 can a user-defined variable giving a certain user-defined weight to record 148 and the time record 148 is stored.

In an embodiment, access count 143 is updated (incremented by 1) each time record 148 is selected by a user through tuner preset 134. In this manner, the frequency of access to record 148 is tracked to determine usage and/or user desirability of listening to radio station 104, 106 stored in record 148.

Software blocks that perform embodiments of the invention are part of computer program modules comprising computer instructions, such as control algorithms, that are stored in a computer-readable medium such as memory described above. Computer instructions can instruct processors to perform methods of storing and selecting a radio station 104, 106. In other embodiments, additional modules could be provided as needed. The components of communications system 100 shown in FIG. 1 are not limiting, and other configurations and components that form communications system 100 are within the scope of the invention.

Figure 2:
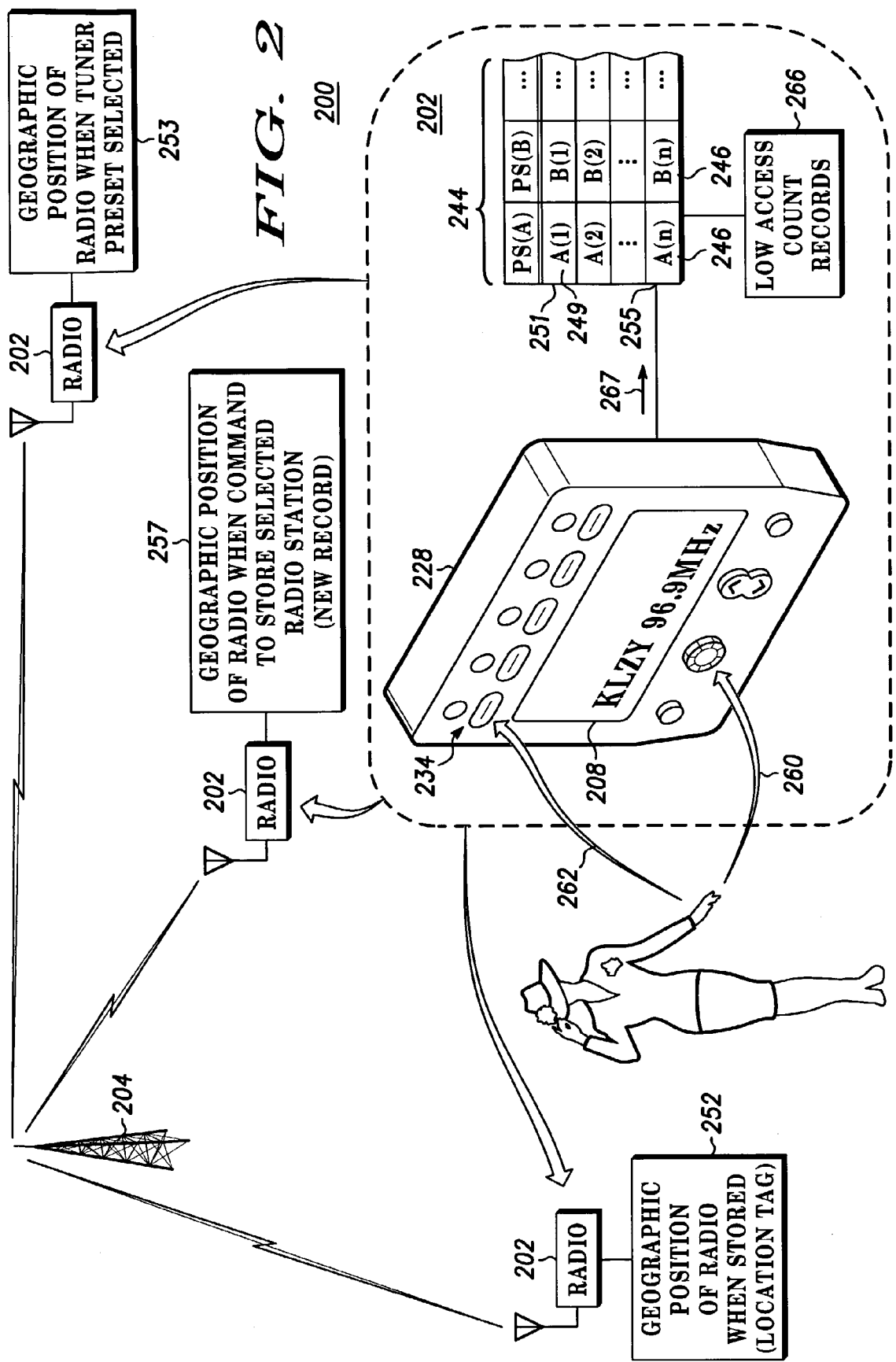
FIG. 2 is a block diagram of a communication system according to another embodiment of the invention.

FIG. 2 is a block diagram of a communication system 200 according to another embodiment of the invention. In the embodiment shown in FIG. 2, radio 202 is shown in various geographic positions, which can include different longitude, latitude, elevation, and the like. As shown in FIG. 2, radio 202 can accept user tuning adjustment 260, for example, by a user dialing in selected-radio station 208 via tuning knob 140 (of human interface 228. Once selected radio station 208 is tuned in, radio 202 can then receive user command to store 262 selected radio station 208, for example, by a user pressing and holding tuner preset 234 on human interface 228. In attempting to store selected radio station 208, it is determined if all of the plurality of memory locations 246 assigned to tuner preset 234 are occupied. For example, if PS(A) is assigned to tuner preset 234, it is determined if each of the plurality of memory locations 246 under PS(A) are occupied. If all of the plurality of memory locations 246 assigned to tuner preset 234 are not occupied, selected radio station can be stored in an unoccupied memory location 255. If all of plurality of memory locations 246 assigned to tuner preset 234 are occupied, selected radio station 208 can be stored by overwriting a previously stored record 249 in an occupied memory location 251.

In an embodiment, overwriting previously stored record 249 can include building a list of low access count records 266 for tuner preset 234. This can comprise a list of previously stored records 249 having an access count 143 below a certain threshold. For example, low access count records 266 can include records with an access count 143 below a certain number in a given amount of time, and the like. The threshold for deriving low access count records 266 can be user configurable, pre-programmed, and the like. In an embodiment, if no records under tuner preset 234 are below the threshold, then the user can select which record is to be overwritten in memory array 244 under tuner preset 234. If low access count records 266 includes only one low access count record, then the one low access count record is replaced with new record 267 corresponding to selected radio station 208.

If low access count records 266 includes more than one low access count record, then radio can identify a low access count record having a geographic position (location tag) 252 furthest from the geographic position 257 of radio 202 at the time the user command to store 262 the selected radio station 208 is received. In an embodiment, identifying this low access count record can be accomplished by calculating, for each of the records in the list of low access count records 266, a straight-line distance equal to the difference between the geographic position 257 of the radio 202 at the time the user command to store 262 selected radio station 208 is received and the geographic position 252 of the radio 202 at the time the low access count record was stored. Subsequent to performing this calculation for each of records in low access count records 266, the low access count record with the largest straight-line distance is flagged and replaced with new record 267 corresponding to selected radio station 208.

In an embodiment also illustrated in FIG. 2, tuner preset 234 can be selected at a time after any number of records 148 are stored in plurality of memory locations 246 under tuner preset 234. As described above, each record 148 stored under tuner preset 234 has geographic position of radio 202 at the time record is stored 252 in addition to temporal stamp 154, radio station frequency 150 and access count 143. In response to subsequent selection of tuner preset 234, a radio station 204 is selected from any of the plurality of radio stations stored under tuner preset 234. In an embodiment, radio station 204 is selected by identifying a record having geographic position 252 (location tag) that is closest to geographic position 253 of radio 202 at the time that tuner preset 234 is selected. Subsequent to identifying such record, radio 202 can be automatically tuned to the radio station 204 associated with the identified record. In an embodiment, the radio station with the closest geographic location 252 (location tag) can be identified by calculating a straight-line distance equal to the difference between the geographic position 253 of radio 202 at the time that tuner preset 234 is selected and the geographic position 252 of radio 202 at the time that record was stored. Subsequent to performing this calculation for each of the records under tuner preset 234, the record with the smallest straight-line distance is flagged and radio 202 is tuned to the radio station 204 of the identified (flagged) record.

In another embodiment illustrated in FIG. 2, temporal stamp 154 can be included in the calculation of which record to select upon subsequent selection of tuner preset 234. In response to subsequent selection of tuner preset 234, radio station 204 is selected by identifying a record having geographic position 252 (location tag) that is closest to geographic position 253 of radio 202 at the time that tuner preset 234 is selected and which has a temporal stamp 154 closest to a time corresponding to the subsequent selection of tuner preset 234. It is possible that when performing the above calculation to select the appropriate radio station 204 from plurality of records under tuner preset 234, that one radio station might have a closer location than another, but that the other radio station has a closer temporal stamp 154. In one embodiment, temporal stamp can be the dispositive factor or dominant factor, while in another embodiment, the smallest straight-line distance can be the dispositive factor or dominant factor. Any combination of weighting schemes between location tag 152 and temporal stamp 154 are conceivable by one skilled in the art and are within the scope of the invention.

Figure 3:
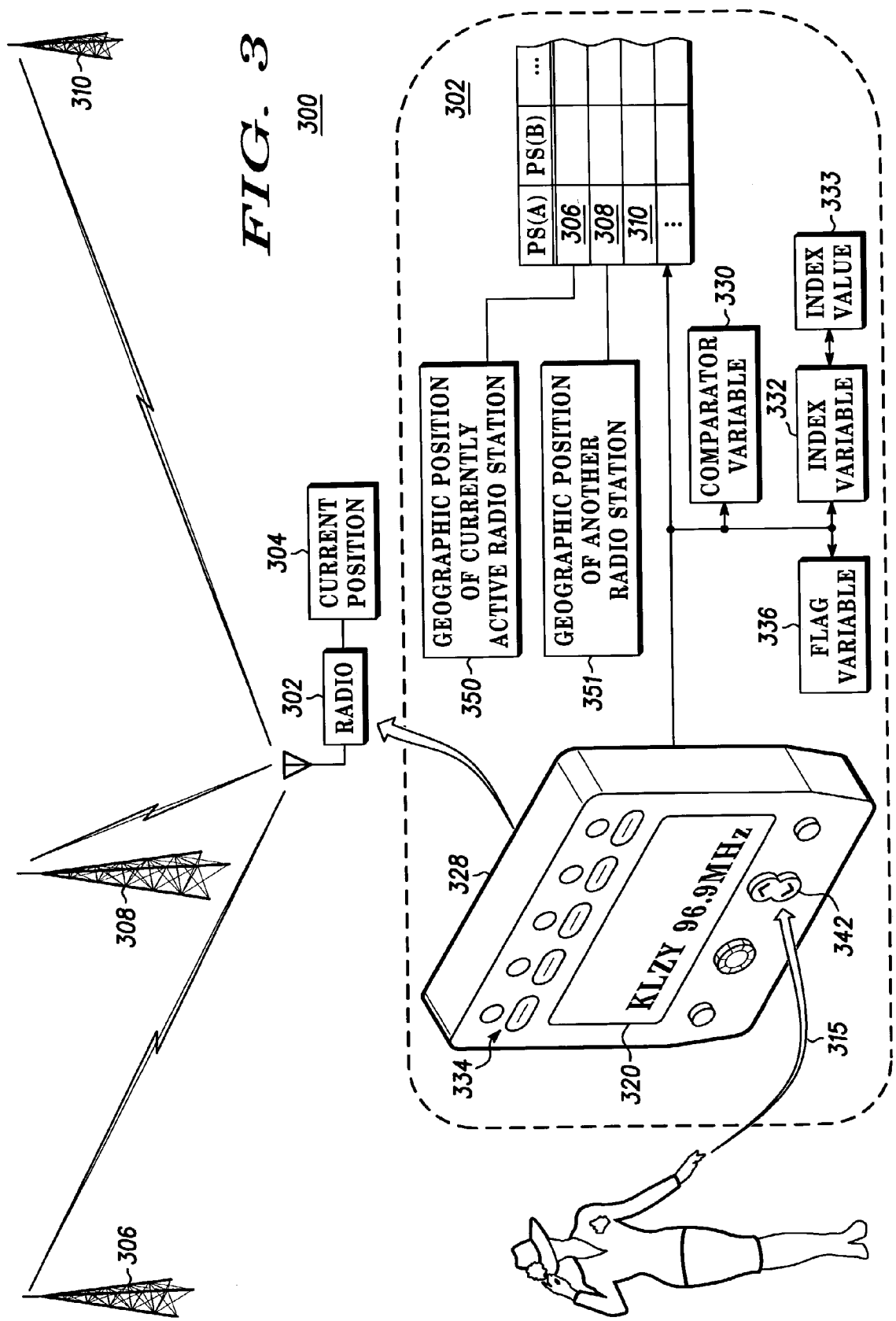
FIG. 3 is a block diagram of a communication system according to yet another embodiment of the invention.

FIG. 3 is a block diagram of a communication system 300 according to yet another embodiment of the invention. As shown in FIG. 3, a user can select another radio station 308 different from currently active radio station 306 under tuner preset 334 by identifying the record under tuner preset 334 having a geographic position that is most proximate to current position 304 of radio 302 and less proximate to current position 304 of radio 302 than geographic position 350 (location tag) of currently active radio station 306. As shown in FIG. 3, a plurality of radio stations 306, 308, 310 can be available to radio 302 at current geographic position 304 of radio 302. In an embodiment, it can be desirable for a user to select another radio station 308 different from a currently active radio station 306 yet still under tuner preset 334. In this embodiment, another radio station 308 can have a geographic position 351 further away from current position 304 of radio 302 than currently active radio station 306, yet closer than still yet another radio station 310.

As described above, a plurality of records can be stored under tuner preset 334, each with a different radio station frequency 320, location tag, and the like. Also as described above, when tuner preset 334 is selected, radio 302 tunes to a radio station having a location tag geographically closest to the current position 304 of radio 302. In an embodiment, if a user wishes to access another radio station 308 different from the currently active station 306 under tuner preset 334, the user can enter a next selection command 315 via the scroll buttons 342. This has the effect of identifying the record under a currently selected tuner preset 334 having a geographic position that is most proximate to current position 304 of radio 302 and less proximate to current position 304 of radio 302 than geographic position 350 (location tag) of currently active radio station 306.

Upon accepting next selection command 315, for each record under tuner preset 334, radio 302 performs an algorithm to determine the proper record meeting the criteria described above. In an embodiment, the algorithm calculates a first straight-line distance between the current geographic position 304 of radio and the geographic position 350 (location tag) corresponding to currently active radio station 306. Next a comparator variable 330 is initialized, and an index variable 332 is initialized with an index value 333. Each index value 333, as incremented, corresponds to each of the plurality of records stored under tuner preset 334. Next a flag variable 336 is initialized at the index value 333 of the record corresponding to currently active radio station 306. A second straight-line distance is calculated equal to the difference between the current geographic position 304 of the radio 302 and the geographic position (location tag) of the record (radio station) stored at the current index value 333. If the second straight-line distance is not less than the first straight-line distance and if the second straight-line distance is less than the comparator variable 330, the comparator variable 330 is set equal to the second straight-line distance and the flag variable 336 is set to equal to the current index value 333. Subsequently, the index variable is incremented by one and the process is repeated for the next record under tuner preset 334. Radio 302 is then tuned to radio station frequency 320 of the record indexed at the current value of the flag variable 336.

The algorithm described above is not meant to be limiting of the invention and other algorithms for accomplishing the same purpose can be devised by one skilled in the art. Any algorithm that of identifies the record under tuner preset 334 having a geographic position that is most proximate to current position 304 of radio 302 and less proximate to current position 304 of radio 302 than geographic position 350 (location tag) of currently active radio station 306 is within the scope of the invention.

In an embodiment of the invention, different users can have a personalized set of radio stations stored under tuner preset 334 unique to that individual. In this embodiment, a user can log onto the radio 302 using a user name, password, and the like, with each tuner preset 334 then comprising records corresponding to radio stations selected by that user.

In another embodiment, position information might be unavailable to radio 302 because GPS is unavailable, cellular phone service is unavailable, and the like. In this embodiment, radio 302 can operate just like prior art radios in that tuner preset 334, when selected, returns the most recently saved radio station and tunes radio 302 the corresponding radio station frequency 320.

Figure 4:
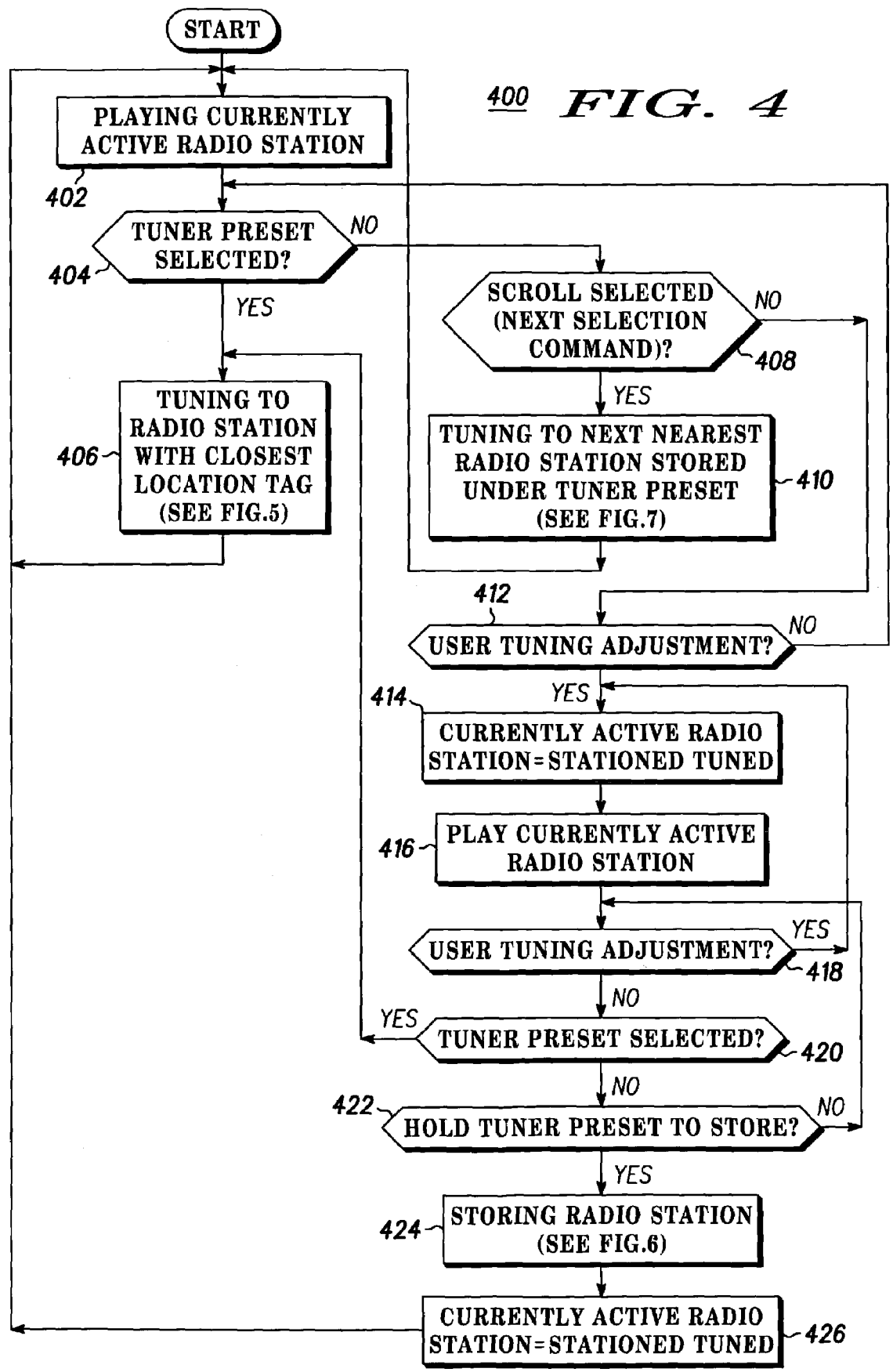
FIG. 4 is a flow chart according to an embodiment of the invention.

FIG. 4 is a flow chart 400 according to an embodiment of the invention. In step 402, radio 102 is playing currently active radio station 306. In step 404, it is determined if tuner preset 134 is selected. If so, in step 406 radio 102 is tuned to radio station 104, 106 under tuner preset 134 having the closest geographic position 152 (location tag) to the current position 304 of radio 102, which then becomes the currently active radio station. 306 and is played per step 402. Step 406 refers to FIG. 5, which further expands on the process of selecting the radio station 104, 106 with the closest location tag 152.

If tuner preset 134 is not selected in step 404, it is determined if a scroll button 142 is selected thereby initiating a next selection command 315 per step 408. If so, in step 410 radio 102 is tuned to radio station 104, 106 having the next nearest location tag 152 under tuner preset 134, which then becomes the currently active radio station 306 and is played per step 402. Step 410 refers to FIG. 7, which further expands on the process of selecting the radio station with the next nearest location tag under tuner preset 134. If scroll button 142 is not selected per step 408, it is determined if there is a user tuning adjustment of radio 102, using for example tuning knob 140, and the like per step 412. If so, the currently active radio station 306 becomes the station tuned per step 414, and the currently active radio station 306 is played per step 416.

In step 418, it is again determined if there is a user tuning adjustment of radio 102. If so, in step 414 currently active radio station 306 becomes the radio station tuned. If not, it is determined if tuner preset 134 is selected per step 420. If so, radio tunes to radio station 104, 106 with location tag 152 closest to current position 304 of radio per step 406. If tuner preset 134 is not selected in step 420, it is determined if tuner preset 134 is held down to store a radio station in step 422. If so, the currently active radio station 306 is stored per step 424. Step 424 refers to FIG. 6, which further expands on the process of storing the currently active radio station 306. After storing in step 424, currently active radio station 306 is the radio station tuned per step 426, and the currently active radio station 306 is played per step 402.

Figure 5:
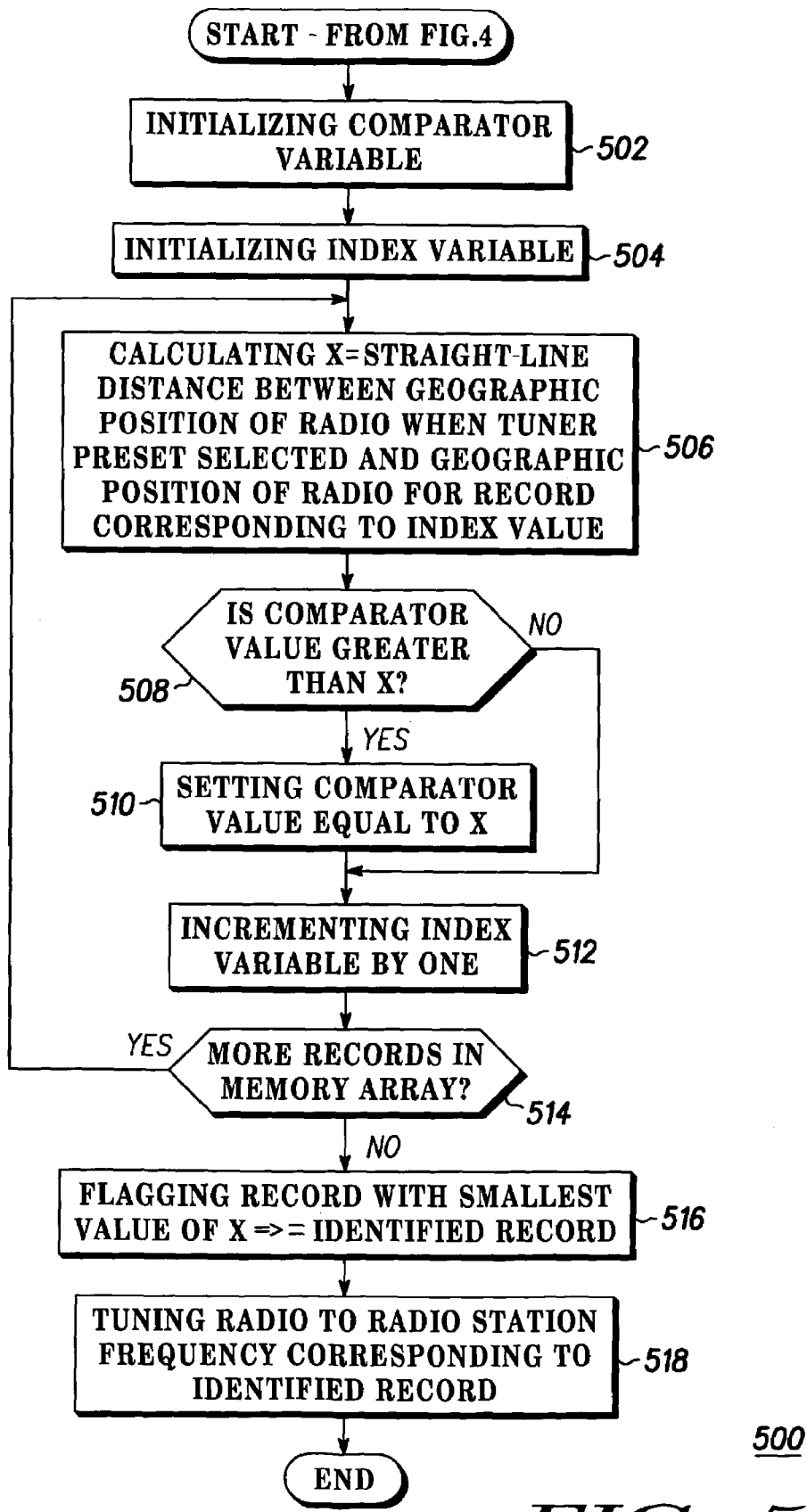
FIG. 5 is a flow chart according to another embodiment of the invention.

FIG. 5 is a flow chart 500 according to another embodiment of the invention. FIG. 5 is a continuation of FIG. 4 and illustrates an embodiment where upon selection of tuner preset 134, radio 102 is tuned to radio station 104, 106 with a location tag 152 closest to current position 304 of radio 102 when tuner preset 134 is selected. In step 502, a comparator variable 330 is initialized. Comparator variable 330 can be initialized at any numerical value. In an embodiment, comparator variable 330 is initialized at a value larger the straight-line distance between the location tag 152 of any stored record 148 under tuner preset 134 and current position 304 of radio when tuner preset 134 is selected.

In step 504 an index variable 332 is initialized at an index value 333, preferably an index value 333 of one. Each index value 333, as incremented, corresponds to each of the plurality of records stored under tuner preset 334. In step 506, "X" is calculated, which is the straight line distance between geographic position 253 when tuner preset 234 is selected and geographic position. 252 of radio 202 when the record corresponding to index value 333 was stored (location tag). In step 508, it is determined if comparator variable 330 is larger than "X." If so, comparator variable 330 is set equal to "X" per step 510 and index variable 332 is incremented by one per step 512. If comparator variable 330 is not larger than "X" in step 508, then step 510 is skipped and index variable in incremented in step 512.

In step 514, it is determined if more records are in memory array 244. If so, steps 506 through 512 are repeated for each of the plurality of records 148 in memory array 144 under tuner preset 134. When all of the plurality of records 148 in memory array 144 under tuner preset 134 have been run through steps 506 through 512, step 514 will indicate that no more records 148 are in memory array 144 and the record under tuner preset 134 with the smallest value of "X," the identified record, is flagged per step 516. In step 518, the radio 302 is tuned to the radio station frequency 150 corresponding to the identified record.

Figure 6:
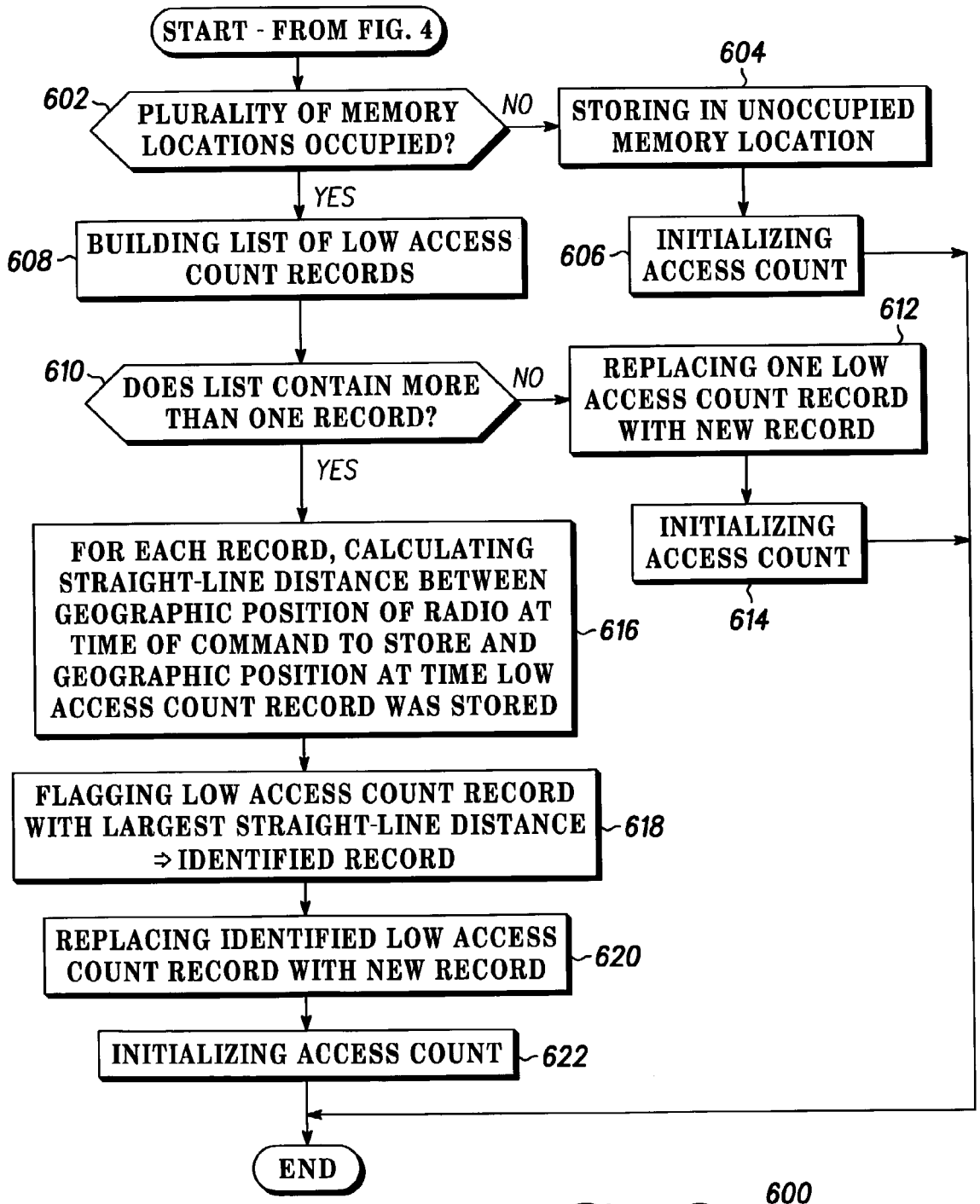
FIG. 6 is a flow chart according to yet another embodiment of the invention.

FIG. 6 is a flow chart 600 according to yet another embodiment of the invention. FIG. 6 is a continuation of FIG. 4 and illustrates an embodiment where upon a currently active radio station 306 is stored in memory array 244. In step 602, it is determined if the plurality of memory locations 246 under tuner preset 234 are occupied. If not, a new record 267 corresponding to the currently active radio station 306 is stored in an unoccupied memory location 255 per step 604. The new record 267 can include radio station frequency 150, location tag 152, temporal stamp 154 and access count 143. In step 606, access count 143 is initialized for the new record 267. In an embodiment, access count 143 is initialized at zero.

If the plurality of memory locations 246 under tuner preset 234 are occupied in step 602, then a list of low access count records 266 under tuner preset 234 is built per step 608. This can comprise a list of previously stored records 249 having an access count 143 below a certain threshold. For example, low access count records 266 can include records with an access count 143 below a certain number in a given amount of time, and the like. In an embodiment, if no records under tuner preset 234 are below the threshold, then the user can select which record is to be overwritten in memory array 244 under tuner preset 234. In step 610, it is determined if the list of low access count records 266 contains more than one record. If not, then the one low access count records is replaced with the new record per step 612, and the access count 143 of the new record 267 is initialized in step 614.

If there is more than one record in the list of low access count records 266, then for each record in the list, calculate the straight-line distance between the geographic position 257 of the radio 202 at the time the user command to store 262 is received and the geographic position 252 of the radio 202 at the time the existing record was stored (location tag) per step 616. In step 618, the low access count record with the largest straight-line distance (identified record) is flagged. In step 620, the identified record is replaced with the new record 267, and in step 622 the access count 143 of the new record 267 is initialized. So in effect, the low access count record with a location tag 252 farthest from the geographic position 257 of radio 202 when the user command to store 262 a new record 267 is received, is replaced.

Figure 7:
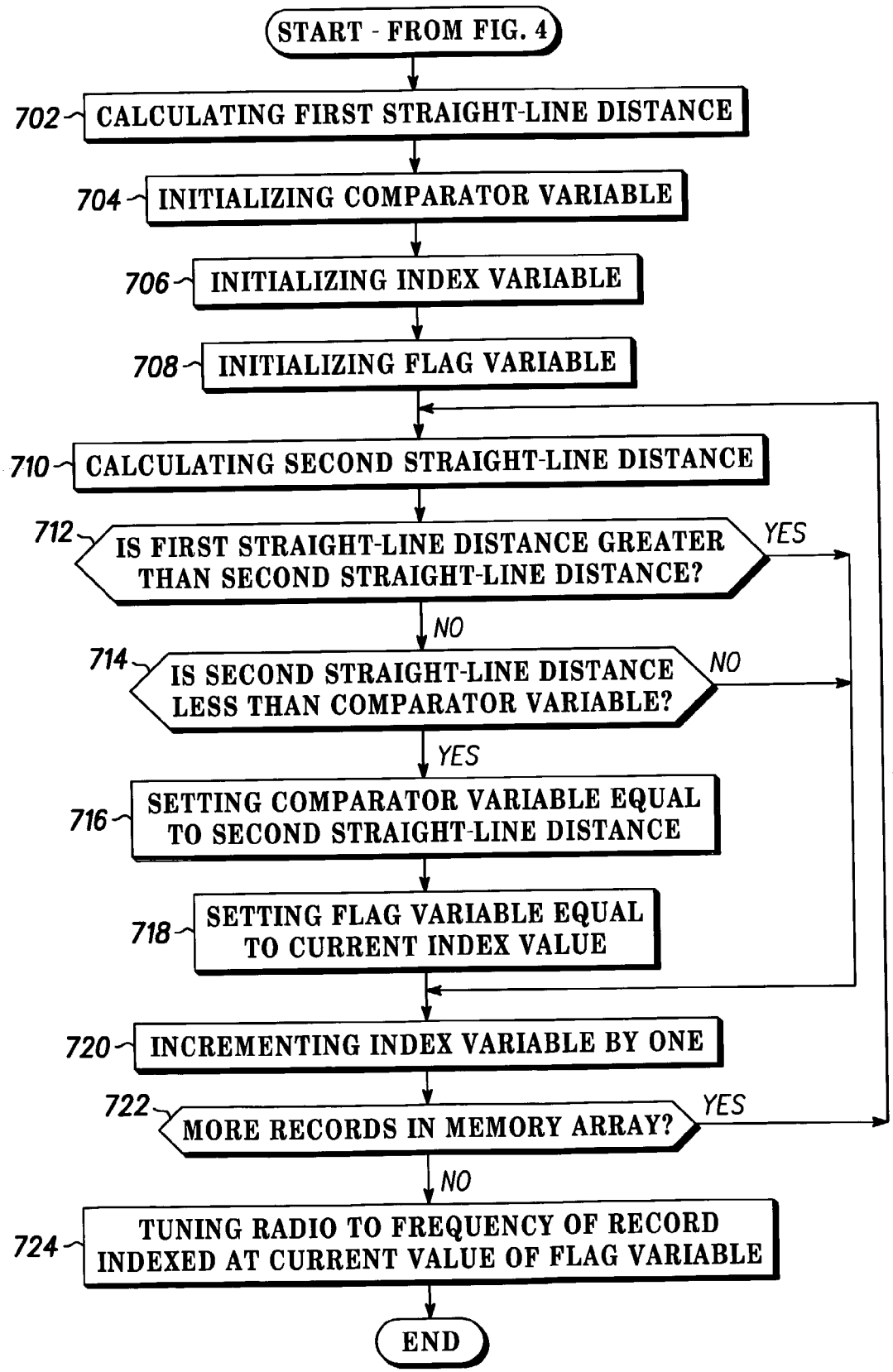
FIG. 7 is a flow chart according to still another embodiment of the invention.

FIG. 7 is a flow chart 700 according to still another embodiment of the invention. FIG. 7 is a continuation of FIG. 4 and illustrates an embodiment where upon the scroll button 342 is used for a next selection command 315 to tune to another radio station 308 stored under tuner preset 334. Another radio station 308 can have a geographic position 351 (location tag) further away from current position 304 of radio 302 than currently active radio station 306, yet closer than still yet another radio station 310 under tuner preset 334.

In step 702, a first straight-line distance is calculated equal to the difference between the current geographic position 304 of radio 302 and the geographic position 350 in the record corresponding to the currently active radio station 306. In step 704, a comparator variable 330 is initialized. Comparator variable 330 can be initialized at any numerical value. In an embodiment, comparator variable 330 is initialized at a value larger the straight-line distance between the location tag 152 of any stored record 148 under tuner preset 134 and current position 304 of radio when tuner preset 134 is selected.

In step 706, an index variable 332 is initialized at an index value 333, preferably an index value 333 of one. Each index value 333, as incremented, corresponds to each of the plurality of records stored under tuner preset 334. In step 708, a flag variable is initialized at the index value 333 of the record corresponding to the currently active radio station 306 under tuner preset 334.

In step 710, a second straight-line distance is calculated equal to the difference between the current geographic position 304 of the radio 302 and the geographic position (location tag) of the record stored at the current index value 333. In steps 712 and 714, it is determined if the second straight-line distance is not less than the first straight-line distance and if the second straight-line distance is less than the comparator variable 330. If these two conditions are met, the comparator variable 330 is set equal to the second straight-line distance in step 716 and the flag variable 336 is set to equal to the current index value 333 in step 718. Subsequently, in step 720 the index variable 332 is incremented by one and the process is repeated for the next record under tuner preset 334 per step 722. In step 724, radio 302 is tuned to radio station frequency 150 of the record indexed at the current value of the flag variable 336. In this manner, the next selection command 315 initiates the identification of the record under tuner preset 334 having a geographic position that is most proximate to current position 304 of radio 302 and less proximate to current position 304 of radio 302 than geographic position 350 (location tag) of currently active radio station 306.

Although the present invention has been described with reference to certain preferred embodiments, numerous modifications and variations can be made by those skilled in the art without departing from the novel spirit and scope of this invention. For example, although the foregoing description has focused on preferences such as location, time of day, and vehicle user, the principles of the proposed method may be extended to implement other type of preferences, such as day of the week (the program content of some radio stations is quite different on the weekend, for example, in which case the user may prefer another station—i.e., WMAQ is great on the weekdays when it provides "all news", but not on the weekend when it is largely a "sports talk" station). The foregoing description focuses on applications to radios, it should be appreciated that the present invention may be implemented in other types of products, cellular telephones, and the like, for which a user desires the same benefits.

The invention claimed is:

1. A method of storing and selecting a radio station in a radio having a plurality of tuner presets and a plurality of memory locations assigned to each of the plurality of tuner presets, comprising:
   storing a plurality of radio stations under a tuner preset, wherein each of the plurality of radio stations is stored as a record in one of the plurality of memory locations assigned to the tuner present, the record comprising: (i) a radio station frequency; and (ii) a geographic position of the radio at a time that the record is stored; and
   in response to subsequent selection of the tuner preset, selecting the radio station from the plurality of radio stations stored under the tuner preset, comprising:
      identifying the record having the geographic position that is closest to a geographic position of the radio at a time that the tuner preset is selected; and
      tuning the radio to the radio station frequency of the identified record,
   wherein the record further comprises an access count corresponding to the radio station stored in the record, storing includes initializing the access count at zero, and selecting the radio station includes incrementing the access count by one.

2. The method of claim 1, wherein identifying includes:
   for each of the records stored under the tuner preset, calculating a straight-line distance equal to the difference between: (i) the geographic position of the radio at the time that the tuner preset is selected; (ii) the geographic position of the radio at the time that the record was stored; and
   flagging the record that yields a smallest straight-line distance.

3. The method of claim 1, further comprising under the tuner preset, selecting another radio station different from a currently active radio station comprising the steps of:
   identifying the record having a geographic position that is:
   (i) most proximate to a current position of the radio; and
   (ii) less proximate to the current position of the radio than the geographic position associated with the currently active radio station.

4. The method of claim 3, wherein selecting another radio station different from the currently active radio station further comprises:
   (a) accepting a next selection command;
   (b) calculating a first straight-line distance equal to the difference between: (i) the current geographic position of the radio; and (ii) the geographic position in the record corresponding to the currently active radio station;
   (c) initializing a comparator variable;
   (d) initializing an index variable with an index value, wherein each index value as incremented corresponds to each of the plurality of records stored under the tuner preset;

(e) initializing a flag variable at the index value of the record corresponding to the currently active radio station;
(f) calculating a second straight-line distance equal to the difference between: (i) the current geographic position of the radio; and (ii) the geographic position of the record stored at a current index value;
(g) if the second straight-line distance is nor less than the first straight-line distance and if the second straight-line distance is less than the comparator variable:
  setting the comparator variable equal to the second straight-line distance; and
  setting the flag variable equal to the current index value;
(h) incrementing the index variable by one;
(i) repeating steps (f), (g), and (h) for each of the records stored under the tuner preset; and
(j) tuning the radio to the radio station frequency of the record indexed at a current value of the flag variable.

5. The method of claim 1 wherein the step of storing further comprises if all of the plurality of memory locations assigned to the tuner preset are occupied, storing the selected radio station by overwriting a previously stored record in an occupied memory location.

6. The method of claim 5 wherein overwriting the previously stored record comprises:
  building a list comprising low access count records tinder the tuner preset; and
  replacing a lowest access count record with a new record corresponding to the selected radio station.

7. A method of storing and selecting a radio station in a radio having plurality of tuner presets and a plurality of memory locations assigned to each of the plurality of tuner presets, comprising:
  storing a plurality of radio stations under a tuner preset, wherein each of the plurality of radio stations is scored as a record in one of the plurality of memory locations assigned to the tuner preset, the record comprising: (i) a radio station frequency; and (ii) geographic position of the radio at a time that the record is stored; and
  in response to subsequent selection or the tuner preset, selecting the radio station from the plurality of radio stations stored under the tuner preset, comprising:
    identifying the record having the geographic position that is closest to a geographic position of the radio at a time that the tuner preset is selected; and
    tuning the radio to the radio station frequency of the identified record, wherein the step of storing Further comprises:
    accepting a user tuning adjustment that tunes the radio to a selected radio station;
    receiving a user command to store the selected radio station under the tuner preset;
    determining if all of the plurality of memory locations assigned to the tuner preset are occupied;
    if all of the plurality of memory locations assigned to the tuner preset are not occupied, storing the selected radio station in an unoccupied memory location; and
    if all of the plurality of memory locations assigned to the tuner preset are occupied, storing the selected radio station by overwriting a previously stored record in an occupied memory location,
  and wherein:
  the record further comprises an access count corresponding to the radio station stored in the record;
  storing includes initializing the access count at zero;
  selecting the radio station includes incrementing the access count by one; and
  overwriting the previously stored record comprises:
    building a list comprising low access count records under the tuner preset;
    if the list includes only one low access count record, replacing the one low access count record with a new record corresponding to the selected radio station; and
    if the list includes more than one low access count record:
      identifying the low access count record having a geographic position furthest from the geographic position of the radio at the time that the user command to store the selected radio station is received; and
      replacing the identified low access count record with the new record corresponding to the selected station.

8. The method of claim 7, wherein identifying the low access count record having the geographic position that is furthest From the geographic position of the radio at the time that the user command to store the selected station is received, comprises:
  for each of the low access count records in the list, calculating a straight-line distance equal to a difference between: (i) the geographic position of the radio at the time that the user command to store the selected radio station is received; and (ii) the geographic position of the radio at the time that the low access count record was stored; and
  flagging the low access count record that yields a largest straight-line distance.

9. A method of storing and selecting a radio station in a radio having a plurality of tuner presets and a plurality of memory locations assigned to each of the plurality of tuner presets, comprising:
  storing a plurality of radio stations under a tuner preset, wherein each of the plurality of radio stations is stored as a record in one of the plurality of memory locations assigned to the tuner presets, the record comprising: (i) a radio stations frequency (ii) a geographic position of the radio at a time that the record is stored; and (iii) a temporal stamp; and
  in response to subsequent selection of the tuner preset, selecting the radio station from the plurality of radio stations stored under the tuner preset, comprising:
    identifying the record having the geographic position that is closest to a geographic position of the radio at a time that the tuner preset is selected and which has a temporal stamp closest to a time corresponding to the subsequent selection of the tuner preset; and
    tuning the radio to the radio station frequency of the identified record.

10. The method of claim 9, wherein identifying comprises for each of the records stored under the tuner preset, calculating a straight-line distance equal to the difference between: (i) the geographic position of the radio at the time that the tuner preset is selected; and (ii) the geographic position of the radio at the time that the record was stored.

11. The method of claim 9, wherein the temporal stamp comprises at least one of a day of a week and a time of day.

12. The method of claim 9, wherein the temporal stamp is a user-defined variable.

13. A computer-readable medium containing computer instructions for instructing a processor to perform a method of storing and selecting a radio station in a radio having a plurality of tuner presets and a plurality of memory locations assigned to each of the plurality of tuner presets, the instructions comprising:

storing a plurality of radio stations under a tuner preset, wherein each of the plurality of radio stations is stored as a record in one of the plurality of memory locations assigned to the tuner presets, the record comprising: (i) a radio stations frequency; (ii) u geographic position of the radio at a time that the record is stored; and (iii) a temporal stamp; and in response to subsequent selection of the tuner preset, selecting a radio station from the plurality of radio stations stored under the tuner preset, comprising:

identifying the record having a geographic position that is closest to the geographic position of the radio at the time that the tuner preset is selected and which has a temporal stamp closest to a time corresponding to the subsequent selection of the tuner preset; and tuning the radio to the station frequency of the identified record.

14. The computer-readable medium of claim 13, wherein the temporal stamp comprises at least one of a day of a week and a time of day.

15. The computer-readable medium of claim 13, wherein the temporal stamp is a user-defined variable.

\* \* \* \* \*

UNITED STATES PATENT AND TRADEMARK OFFICE
CERTIFICATE OF CORRECTION

PATENT NO. : 7,054,601 B2
APPLICATION NO. : 10/340515
DATED : May 30, 2006
INVENTOR(S) : Heiderscheit et al.

It is certified that error appears in the above-identified patent and that said Letters Patent is hereby corrected as shown below:

In claim 6, line 27, change "tinder" to --under--

In claim 7, line 49, change "Further" to --further--

In claim 8, line 22, change "From" to --from--

In claim 9, line 42, change "stations" to --station--

In claim 13, line 8, change "presets" to --preset--

In claim 13, line 9, change "stations" to --station--

Signed and Sealed this

Twelfth Day of December, 2006

JON W. DUDAS
*Director of the United States Patent and Trademark Office*